(12) United States Patent
Choi et al.

(10) Patent No.: US 12,745,652 B2
(45) Date of Patent: Sep. 22, 2026

(54) SEMICONDUCTOR PACKAGE AND METHOD OF MANUFACTURING

(71) Applicant: SAMSUNG ELECTRONICS CO., LTD., Suwon-si (KR)

(72) Inventors: Jaewon Choi, Suwon-si (KR); Jongbo Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 715 days.

(21) Appl. No.: 18/118,303

(22) Filed: Mar. 7, 2023

(65) Prior Publication Data

US 2024/0079250 A1 Mar. 7, 2024

(30) Foreign Application Priority Data

Sep. 2, 2022 (KR) ........................ 10-2022-0111415

(51) Int. Cl.
*H10W 70/05* (2026.01)
*H10W 70/65* (2026.01)
(Continued)

(52) U.S. Cl.
CPC ......... *H10W 70/093* (2026.01); *H10W 70/05* (2026.01); *H10W 70/095* (2026.01);
(Continued)

(58) Field of Classification Search
CPC ..................... H01L 2224/16155–16168; H01L 2224/16225–1624; H01L 2224/32155–32168; H01L 2224/32225–3224; H01L 25/18; H01L 25/16; H01L 23/49822; H01L 23/49838;
(Continued)

(56) References Cited

U.S. PATENT DOCUMENTS 6,885,538 B1 4/2005 Ishii et al.
8,873,247 B2 10/2014 Hosokawa
(Continued)

FOREIGN PATENT DOCUMENTS

KR 0163975 B1 * 4/1999 ........... H05K 3/3452
KR 1025732 A 3/2010

*Primary Examiner* — Evan G Clinton
(74) *Attorney, Agent, or Firm* — Fish & Richardson P.C.

(57) ABSTRACT

A method of manufacturing a semiconductor package includes; positioning a passive element on an upper insulating layer of a package substrate, wherein the upper insulating layer of the package substrate exposes upper surfaces of first substrate pads and second substrate pads, the passive element includes; electrodes on respective corners of a lower surface of the passive element, solder members respectively on the electrodes, and an insulating spacer on a central portion of the lower surface of the passive element between the solder members, and the solder members are respectively disposed on the second substrate pads. The method further includes; bonding the passive element on the package substrate through the solder members and the second substrate pads, and bonding a semiconductor device to the first substrate pads on the package substrate through conductive bumps on a lower surface of the semiconductor device, wherein the semiconductor device is laterally spaced apart from the passive element on the package substrate.

15 Claims, 11 Drawing Sheets

(51) Int. Cl.
*H10W 70/685* (2026.01)
*H10W 70/69* (2026.01)
*H10W 90/00* (2026.01)
*H10W 72/00* (2026.01)
*H10W 74/15* (2026.01)

(52) U.S. Cl.
CPC ......... *H10W 70/65* (2026.01); *H10W 70/685* (2026.01); *H10W 70/69* (2026.01); *H10W 90/00* (2026.01); *H10W 90/701* (2026.01); *H10W 72/07232* (2026.01); *H10W 74/15* (2026.01); *H10W 90/724* (2026.01); *H10W 90/734* (2026.01)

(58) Field of Classification Search
CPC ......... H01L 24/32; H01L 24/73; H01L 24/13; H01L 24/83; H01L 21/52
See application file for complete search history.

(56) References Cited

U.S. PATENT DOCUMENTS

| | | | | |
|---|---|---|---|---|
| 11,244,919 | B2 | 2/2022 | Hsiao et al. | |
| 2012/0020041 | A1* | 1/2012 | Hosokawa | H01L 23/3128 361/748 |
| 2015/0062852 | A1 | 3/2015 | Lee et al. | |
| 2015/0162327 | A1 | 6/2015 | Niiyama | |
| 2021/0398908 | A1 | 12/2021 | Jin et al. | |
| 2022/0077065 | A1* | 3/2022 | Kuan | H01L 23/13 |
| 2023/0369160 | A1* | 11/2023 | Kshirsagar | H01L 23/5384 |

* cited by examiner

SEMICONDUCTOR PACKAGE AND METHOD OF MANUFACTURING

CROSS-REFERENCE TO RELATED APPLICATION

This U.S. non-provisional patent application claims priority under 35 U.S.C. § 119 to Korean Patent Application No. 10-2022-0111415 filed on Sep. 2, 2022 in the Korean Intellectual Property Office (KIPO), the subject matter of which is hereby incorporated by reference in its entirety.

BACKGROUND

1. Field

Embodiments of the inventive concept relate generally to semiconductor packages and methods of manufacturing semiconductor packages. More particularly, embodiments of the inventive concept relate to semiconductor packages including a plurality of semiconductor elements and methods of manufacturing same.

2. Description of the Related Art

The fabrication of a semiconductor package usually involves the use of one or more processes (hereafter, individually or collectively, "mounting processes") that mount (e.g., mechanically assembly and/or electrically connect) various semiconductor elements on a package substrate. Unfortunately, the mounting processes often apply heat and pressure to the semiconductor elements and/or the package substrate, and such heat and pressure may adversely stress the semiconductor elements.

Further, a space (or separation) may exist between the mounted semiconductor elements and the package substrate, and the space is often a location at which applied stress associated with the mounting processes is most apparent. As a result, damage associated with mechanical and/or thermal stress (e.g., cracking) may occur in relation to the space between the semiconductor elements and the package substrate.

SUMMARY

Embodiments of the inventive concept provide semiconductor packages including an insulating spacer that inhibits or prevents damage to semiconductor elements during the mounting processes. Other embodiments of the inventive concept provide methods of manufacturing such semiconductor packages.

According to embodiments of the inventive concept, a method of manufacturing a semiconductor package may include; positioning at least one semiconductor element on an upper insulating layer of a package substrate, wherein the upper insulating layer of the package substrate exposes upper surfaces of first substrate pads and second substrate pads, each semiconductor element among the at least one semiconductor element includes electrodes on a lower surface of the at least one semiconductor element and respectively disposed in a peripheral region of the semiconductor element, solder members respectively on the electrodes, and an insulating spacer on the lower surface of the semiconductor element and disposed in a central portion of the semiconductor element between the solder members, and the solder members are respectively disposed on the second substrate pads. And the method further includes; bonding the at least one semiconductor element on the package substrate using the solder members, and bonding a semiconductor device on the package substrate, wherein the semiconductor device is laterally spaced apart from the semiconductor element on the package substrate.

According to embodiments of the inventive concept, a method of manufacturing a semiconductor package may include; positioning a passive element on an upper insulating layer of a package substrate, wherein the upper insulating layer of the package substrate exposes upper surfaces of first substrate pads and second substrate pads, the passive element includes; electrodes on respective corners of a lower surface of the passive element, solder members respectively on the electrodes, and an insulating spacer on a central portion of the lower surface of the passive element between the solder members, and the solder members are respectively disposed on the second substrate pads. And the method may further include bonding the passive element on the package substrate through the solder members and the second substrate pads, and bonding a semiconductor device to the first substrate pads on the package substrate through conductive bumps on a lower surface of the semiconductor device, wherein the semiconductor device is laterally spaced apart from the passive element on the package substrate.

According to embodiments of the inventive concept, a semiconductor package may include; a package substrate including an upper surface and an opposing lower surface, an upper insulating layer on the upper surface of the package substrate and exposing at least portions of first substrate pads and second substrate pads, a lower insulating layer on the lower surface of the package substrate and exposing at least portions of third substrate pads, a semiconductor device on the upper surface of the package substrate and electrically connected to the first substrate pads, and a semiconductor element on the upper surface of the package substrate, spaced apart from the semiconductor device, electrically connected to the second substrate pads through solder members peripherally disposed on a lower surface of the semiconductor element, and including an insulating spacer centrally disposed on the lower surface of the semiconductor element between the solder members.

BRIEF DESCRIPTION OF THE DRAWINGS

Advantages, benefits and features, as well as the making and use of the inventive concept, may be more clearly understood upon consideration of the following detailed description together with the accompanying drawings, in which.

DETAILED DESCRIPTION

Throughout the written description and drawings, like reference numbers and labels are used to denote like or similar elements, components, devices, features and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
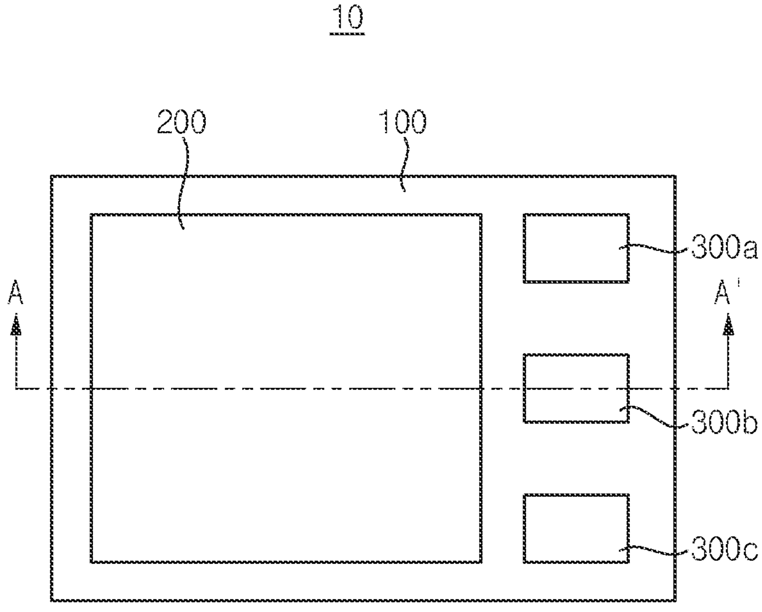
FIG. 1 is a plan (or top down) view illustrating a semiconductor package according to embodiments of the inventive concept.
Figure 2:
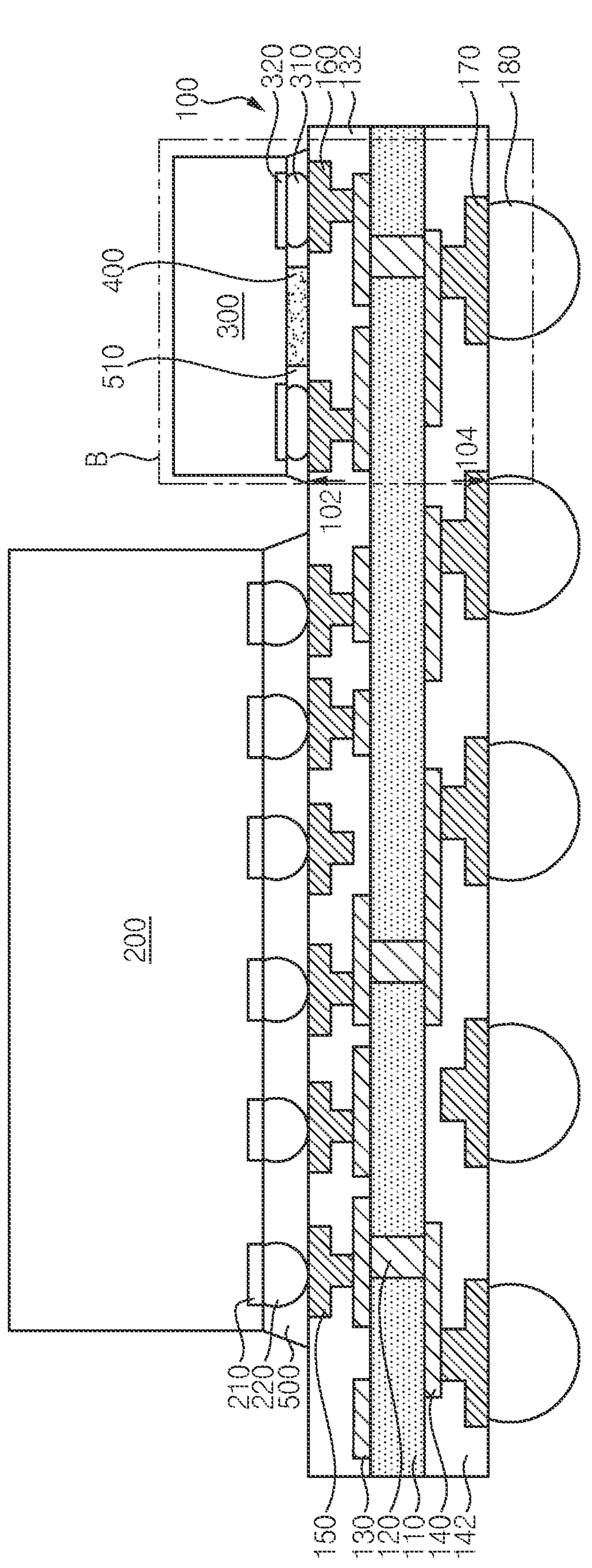
FIG. 2 is a cross-sectional view taken along line A-A' of FIG. 1.

Figure (FIG. 1 is a plan view illustrating a semiconductor package 10 according to embodiments of the inventive concept; FIG. 2 is a cross-sectional view taken along line A-A' of FIG. 1; and FIG. 3 is an enlarged cross-sectional view further illustrating region 'B' indicated in FIG. 2.

Figure 3:
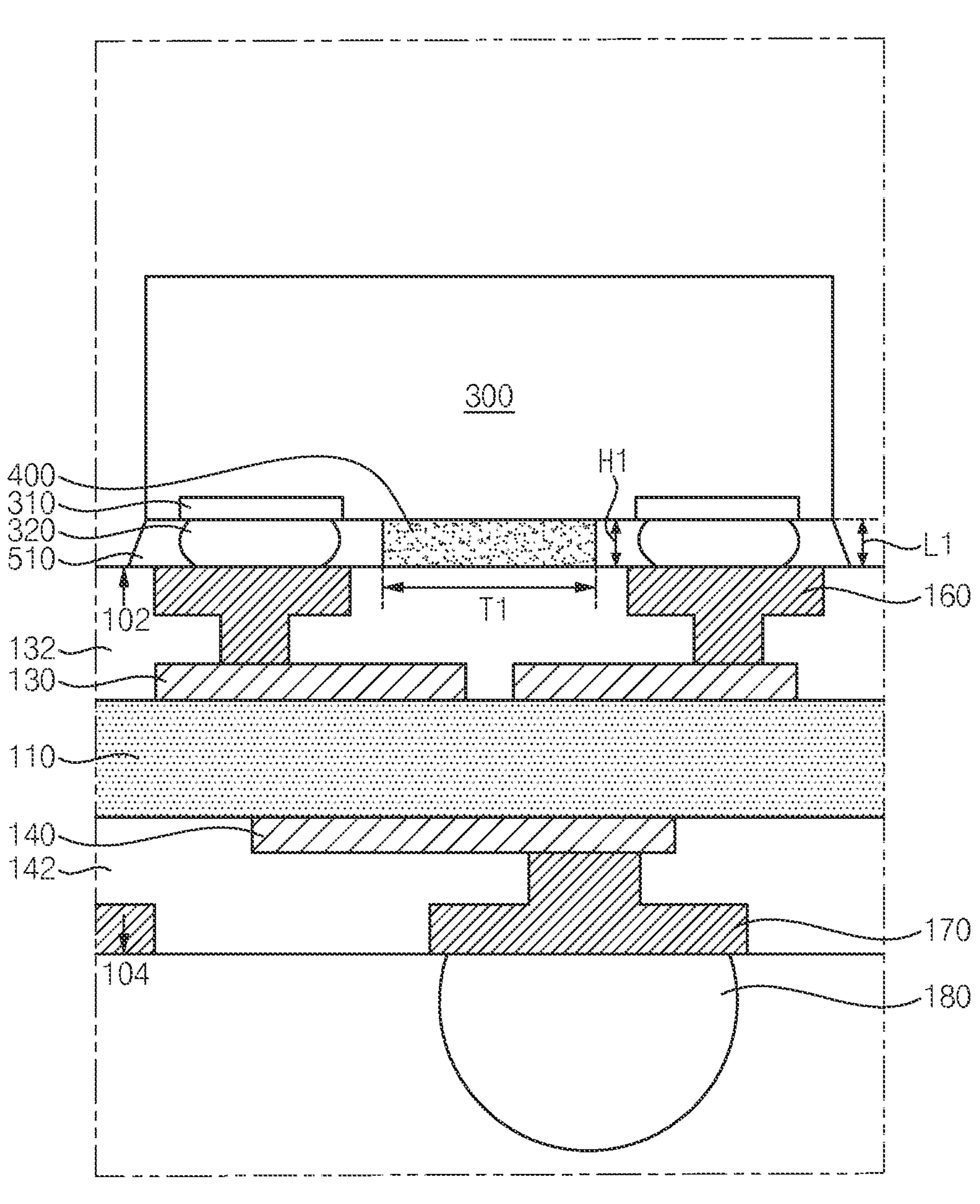
FIG. 3 is an enlarged cross-sectional view further illustrating region 'B' indicated FIG. 2.

Referring to FIGS. 1, 2 and 3, the semiconductor package 10 may generally include a package substrate 100, a semiconductor device 200 disposed on the package substrate 100, at least one semiconductor element 300 electrically connected to the semiconductor device 200, and an insulating spacer 400 provided between the semiconductor element 300 and the package substrate 100.

In some embodiments, the semiconductor device 200 and the semiconductor element 300 may be indirectly connected through one or more intervening circuits associated with the package substrate 100. The semiconductor device 200 may include conductive bumps 220 respectively provided on chip pads 210 on a lower surface of the semiconductor device 200. The semiconductor element 300 may include solder members 320 provided on electrodes 310 on a lower surface of the semiconductor element 300. The semiconductor device 200 and the semiconductor element 300 may be mounted on the package substrate 100 and electrically connected through the conductive bumps 220 and the solder members 320.

In some embodiments, the package substrate 100 may be understood as including an upper surface 102 and an opposing lower surface 104. The package substrate 100 may include, for example, a printed circuit board (PCB), a flexible substrate, a tape substrate, and the like. Here, the PCB may be a multilayer circuit board including various circuits and connecting vias.

The package substrate 100 may include a core layer 110, conductive through vias 120, upper conductive patterns 130, an upper insulating layer 132, lower conductive patterns 140, lower insulating layer 142, and a plurality of first, second and third substrate pads 150, 160, 170. The package substrate 100 may further include a plurality of external connection bumps 180.

The core layer 110 may include a non-conductive material layer, such as for example, a reinforced polymer or the like. The conductive through via 120 may extend through the core layer 110 to variously and electrically connect the upper conductive pattern 130 and the lower conductive pattern 140.

The first and second substrate pads 150, 160 respectively connecting the upper conductive patterns 130 may be disposed on the upper surface 102 of the package substrate 100. The upper conductive patterns 130 may extend along an upper surface of the core layer 110 within the package substrate 100. The upper conductive patterns 130 may be provided in the upper insulating layer 132. The upper conductive patterns 130 may extend along one surface of the core layer 110. For example, at least certain portions of the upper conductive patterns 130 may be used as the first and second substrate pads 150, 160, and may also serve as landing pads.

The third substrate pads 170 respectively connecting the lower conductive patterns 140 may be disposed on the lower surface 104 of the package substrate 100. The lower conductive patterns 140 may extend in the package substrate 100. The lower conductive patterns 140 may be provided in the lower insulating layer 142. The lower conductive patterns 140 may extend along a lower surface of the core layer 110. For example, at least some portion of the lower conductive patterns 140 may be used as the third substrate pads 170, and may also serve as landing pads.

The upper conductive patterns 130 and the lower conductive patterns 140 may variously include ground wiring and/or power wiring that collectively serves as a power net supplying power to semiconductor elements, components and devices (hereafter, individually, collectively or in combination, "electronic components") mounted on the package substrate 100. Accordingly, the first, second and third substrate pads 150, 160, 170 may variously include power pad(s) and/or ground pad(s) connected as part of the ground wiring and/or power wiring. In addition, the first, second and third substrate pads 150, 160, 170 may further include various substrate signal wirings and substrate signal pads for connecting data signals to the electronic components.

The upper and lower conductive patterns 130, 140, as well as the first, second and third substrate pads 150, 160, 170 may include, at least one of for example, aluminum (Al), copper (Cu), tin (Sn), nickel (Ni), gold (Au) and platinum (Pt). The upper and lower conductive patterns 130, 140 and the first, second and third substrate pads 150, 160, 170 may be formed using at least one of a plating process, an electroless plating process, a vapor deposition process, or the like.

The upper insulating layer 132 may be formed on the upper surface 102 of the package substrate 100 to at least partially cover the upper conductive patterns 130. In this regard the first and second substrate pads 150, 160 may be exposed through the upper insulating layer 132. For example, the upper insulating layer 132 may entirely cover the upper surface 102 of the package substrate 100, except for upper surfaces of the first and second substrate pads 150, 160.

The lower insulating layer 142 may be formed on the lower surface 104 of the package substrate 100 to at least partially cover the lower conductive patterns 140. Thus, the third substrate pads 170 may be exposed through the lower insulating layer 142. For example, the lower insulating layer 142 may entirely cover the lower surface 104 of the package substrate 100, except for upper surfaces of the third substrate pads 170.

Each of the upper and lower insulating layers 132, 142 may include at least one of for example; a polymer, a dielectric layer, a silicon oxide layer, a silicon nitride layer, and a silicon oxynitride layer. Each of the upper and lower insulating layers 132, 142 may be formed using a vapor deposition process, a spin coating process, or the like.

The external connection bumps 180 may be respectively connected to the third substrate pads 170 provided on the lower surface 104 of the package substrate 100, and may be used to electrically connect the semiconductor package 10 to one or more external circuits. Thus, at least a portion of the external connection bumps 180 may be exposed through the lower insulating layer 142. The external connection bump 180 may include, for example, a solder ball. In this regard, in some embodiments, the semiconductor package 10 may be mounted on a module substrate (not shown) via the connection bumps 180 (e.g., solder balls) to form a semiconductor module.

Those skilled in the art will appreciate that the number and arrangement of substrate pads (e.g., the first, second and third substrate pads 150, 160, 1700 is a matter of design choice. Further, those skilled in the art will appreciate that one or more wirings may be used to variously interconnect the substrate pads.

In some embodiments, the semiconductor device 200 may be disposed on the upper surface 102 of the package substrate 100. In this regard, the semiconductor device 200 may be mounted on the package substrate 100 using a flip chip bonding method. Assuming that the semiconductor device 200 is mounted on the upper surface 102 of the package substrate 100, the semiconductor device 200 may be electrically connected to the first substrate pads 150. That is, the chip pads 210 of the semiconductor device 200 may be electrically connected to the first substrate pads 150 of the package substrate 100 by the conductive bumps 220 serving as conductive connecting members. In some embodiments, the conductive bumps 220 may include micro bumps (μBumps).

Alternately, the semiconductor device 200 may be disposed on the package substrate 100 using a wire bonding method. That is, the chip pads 210 of the semiconductor device 200 may be electrically connected to the first substrate pads 150 of the package substrate 100 with bonding wirings serving as conductive connection members.

A first adhesive 500 may underfill between the semiconductor device 200 and the package substrate 100. In this manner, the first adhesive 500 may serve to reinforce a space (or gap) between the semiconductor device 200 and the package substrate 100.

Consistent with certain embodiments of the inventive concept, the semiconductor device 200 may include a central processing unit (CPU), a graphics processing unit (GPU), a micro processing unit (MPU), a micro controller unit (MCU), and/or application processor (AP).

In some embodiments, one or more semiconductor elements 300 (e.g., at least one semiconductor element 300) may be disposed on the upper surface 102 of the package substrate 100. Here, when more that one semiconductor elements 300 are provided on the package substrate 100, each of the semiconductor elements 300 may have at least one geometric feature (e.g., width, length, height, shape, thickness, texture, etc.) that is substantially the same. The semiconductor elements 300 may be laterally separated (or spaced apart) from the semiconductor device 200 on the upper surface of the package substrate 100. In some embodiments, the semiconductor element 300 may be electrically connected to the semiconductor device 200 in order to remove noise and/or otherwise regulate (or condition) supply power.

In some embodiments, a number of the semiconductor elements 300 disposed on the package substrate 100 falls within a range of 2 to 15. Here, each one of the semiconductor elements 300 may include a passive element, such as for example; a Multi-Layer Ceramic Capacitor (MLCC), a Low Inductance Chip Capacitor (LICC), a Land Side Capacitor (LSC), an inductor, an Integrated Passive Device (IPD), etc.

The respective semiconductor elements 300 may be mounted on the package substrate 100 using a flip chip bonding method. In this regard, the semiconductor element 300 may be electrically connected to the second substrate pads 160. The electrodes 310 of the semiconductor element 300 may be electrically connected to the second substrate pads 160 of the package substrate 100 via the solder members 320 serving as conductive connection members. here, for example, the solder members 320 may include micro bumps (μBumps).

A second adhesive 510 may underfill between each of the semiconductor elements 300 and the package substrate 100. That is, the second adhesive 510 may be used to reinforce a space (or gap) between each of the semiconductor elements 300 and the package substrate 100.

Referring to FIG. 3, a lower surface of a semiconductor element 300 may be spaced apart from the upper surface 102 of the package substrate 100 by a vertical separating distance L1 that (e.g., falling within a range of from about 2 μm to about 10 μm.

The solder members 320 may be provided in peripheral region(s) laterally disposed in relation to a central region on the lower surface of the semiconductor element 300. The solder members 320 may support the semiconductor element 300 on the lower surface of the semiconductor element 300. That is, the solder members 320 may vertically support (and thereby resist mounting stress at) lateral (or outer), opposing end portions of the lower surface of the semiconductor element 300.

In addition in some embodiments, the insulating spacer 400 may be provided between the package substrate 100 and the semiconductor element 300, so as to vertically support (and thereby resist mounting stress at) a central portion of the lower surface of the semiconductor element 300. In some embodiments, the insulating spacer 400 may have a hexahedral shape. Accordingly, the insulating spacer 400 may be disposed in a central portion of the lower surface of the semiconductor element 300. And with this disposition, the insulation spacer 400 may be used to vertically support the semiconductor element 300 together with the solder members 320. That is, the insulating spacer 400 may be used to distribute stress that would otherwise be vertically applied through the solder members 320 and onto the package substrate 100.

In some embodiments including more than one semiconductor element 300, each of the insulating spacers 400 corresponding to a respective one of the semiconductor elements 300 may have at least one geometric feature (e.g., width, length, height, shape, thickness, texture, etc.) that is substantially the same.

In some embodiments, the insulating spacer 400 may contact the lower surface of the semiconductor element 300 and extend downward with a height H1, wherein the height H1 of the insulating spacer 400 may be less than or equal to the vertical separating distance L1 between the lower surface of the semiconductor element 300 to the upper surface 102 of the package substrate 100. In some embodiments, the height H1 may fall within a range of from about 2 μm to about 10 μm.

In some embodiments, the insulating spacer 400 may have a (lateral) width T1, wherein the width T1 of the insulating spacer 400 is less than a horizontal separating distance between the solder members 320. In some embodiments, for example, the width T1 of the insulating spacer 400 may fall within a range of from about 15 μm to about 50 μm.

In some embodiment, for example, the insulating spacer 400 may include at least one of a die attach film (DAF), an epoxy molding compound (EMC), an epoxy resin, a Ultra-Violet (UV) resin, a polyurethane resin, a silicone resin, a silica filler, etc.

As described above, the insulating spacer 400 provided between the semiconductor element 300 and the package substrate 100 may substantially fill a space (or gap) between the semiconductor element 300 and the package substrate 100. Since the insulating spacer 400 vertically supports a central portion of the semiconductor element 300 during mounting process(es) used to bond the semiconductor element 300 to the package substrate 100, the semiconductor element 300 is significantly less likely to become damaged. That is, the insulating spacer 400 may effectively distribute and/or resist vertical stress to thereby prevent cracking that might otherwise occur in the semiconductor element 300.

Hereinafter, an exemplary method of manufacturing the semiconductor package 10 of FIG. 1 will be described in relation to FIGS. 4 to 12.

Figure 4:
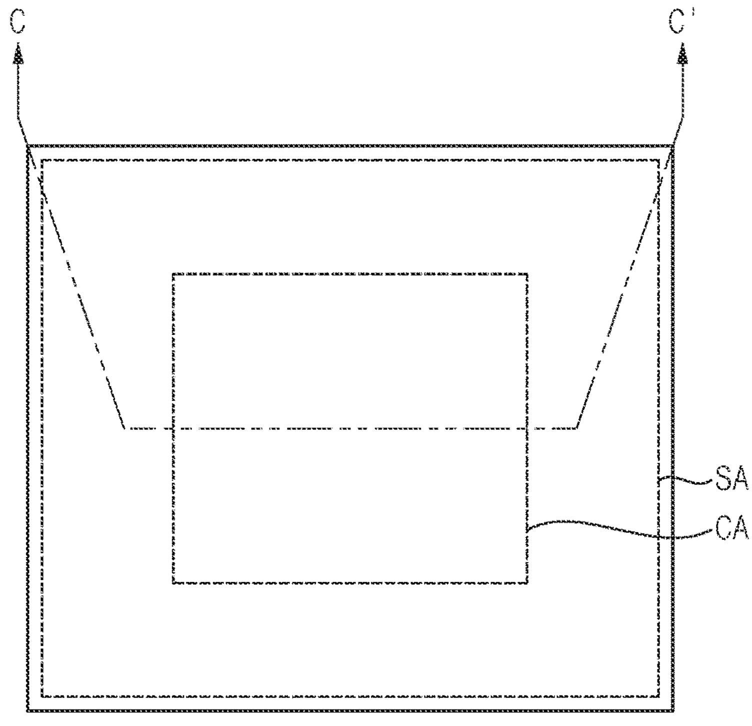
FIGS. 4, 5, 6, 7, 8, 9, 10, 11 and 12 (hereafter collectively, "FIGS. 4 to 12") are cross-sectional views further illustrating in various aspects a method of manufacturing a semiconductor package according to embodiments of the inventive concept.
Figure 5:
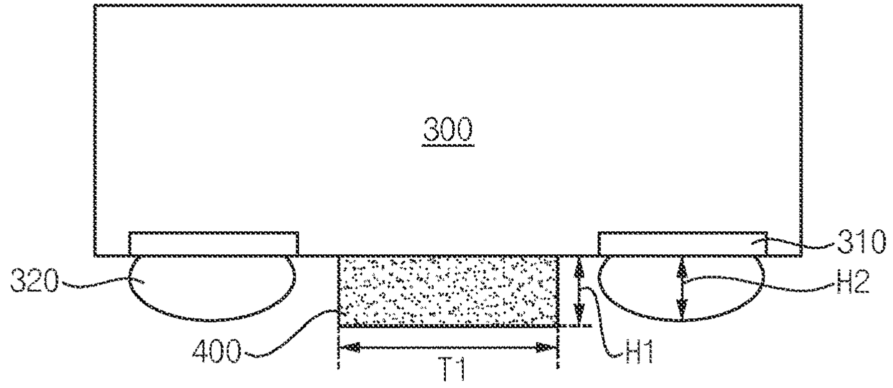
Figure 6:
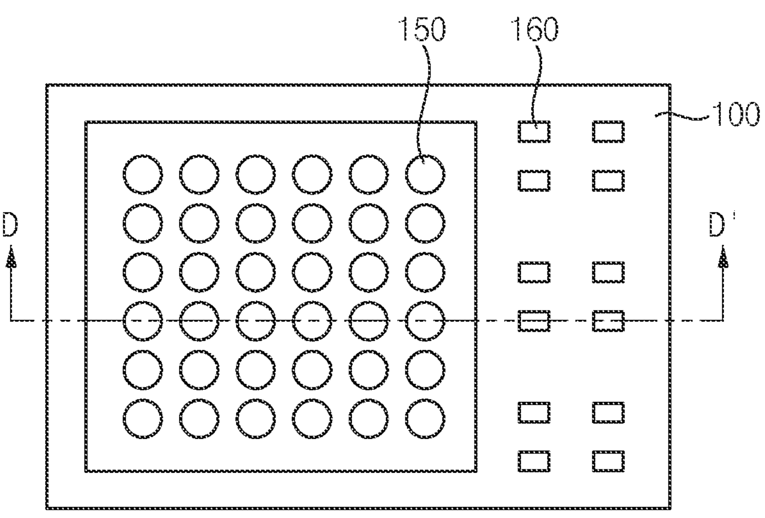
Figure 7:
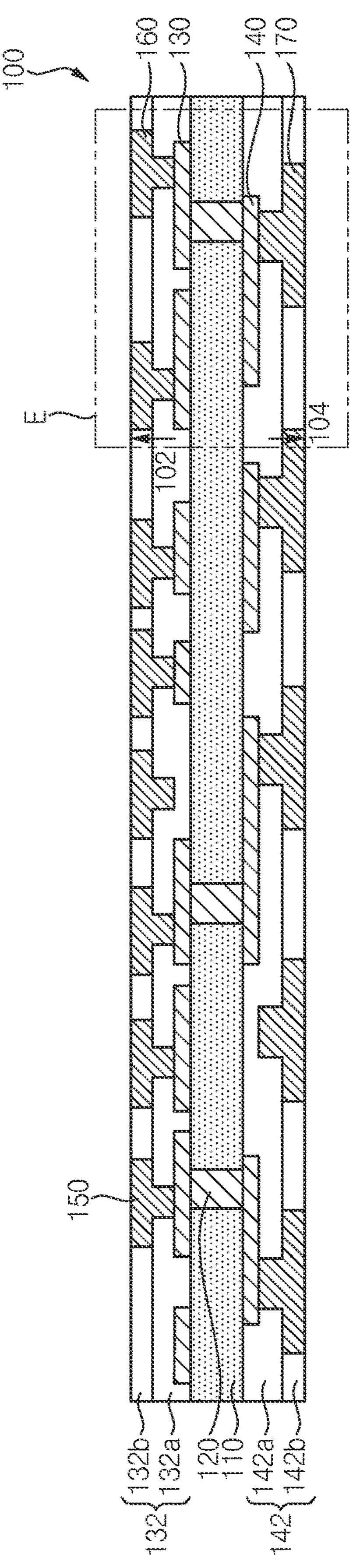
Figure 8:
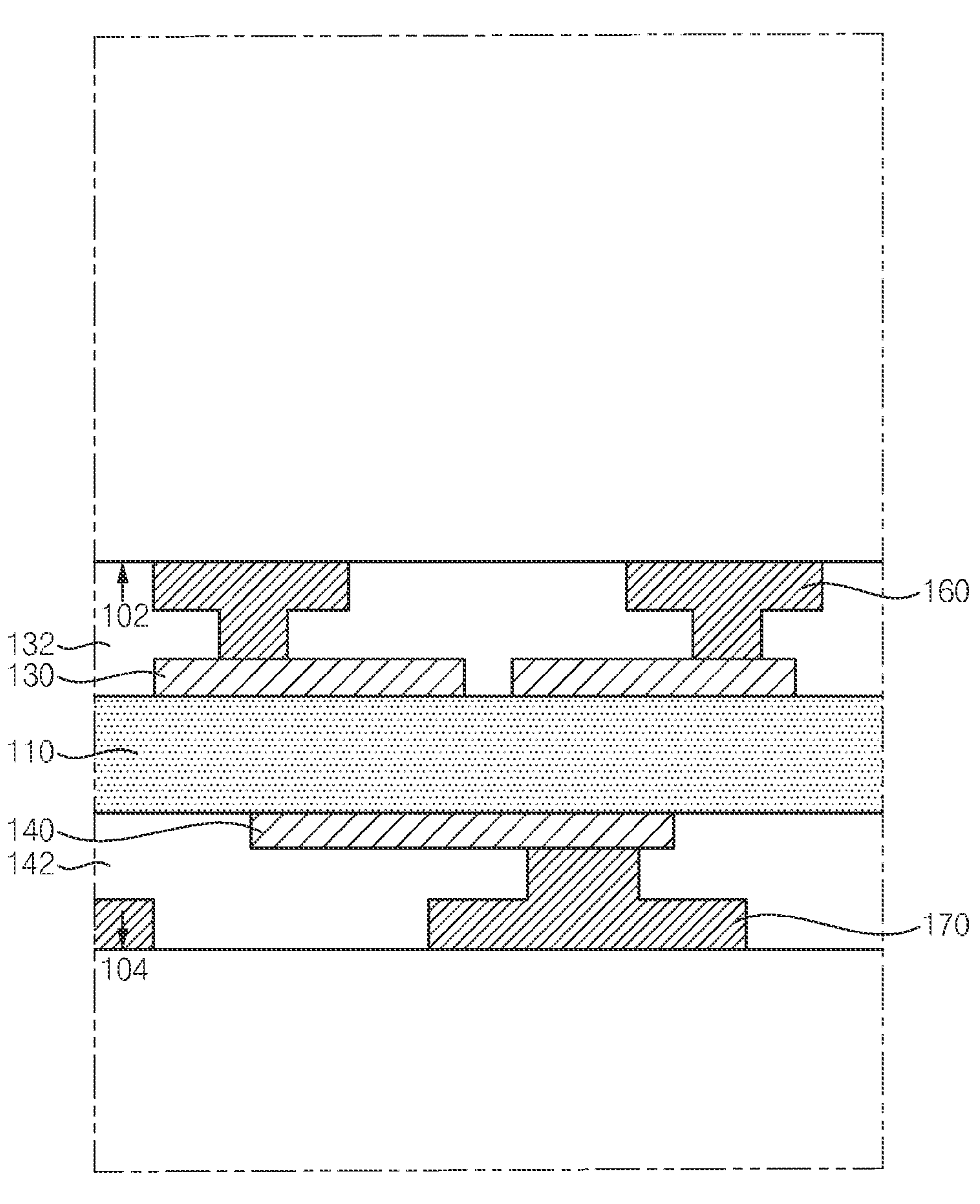
Figure 9:
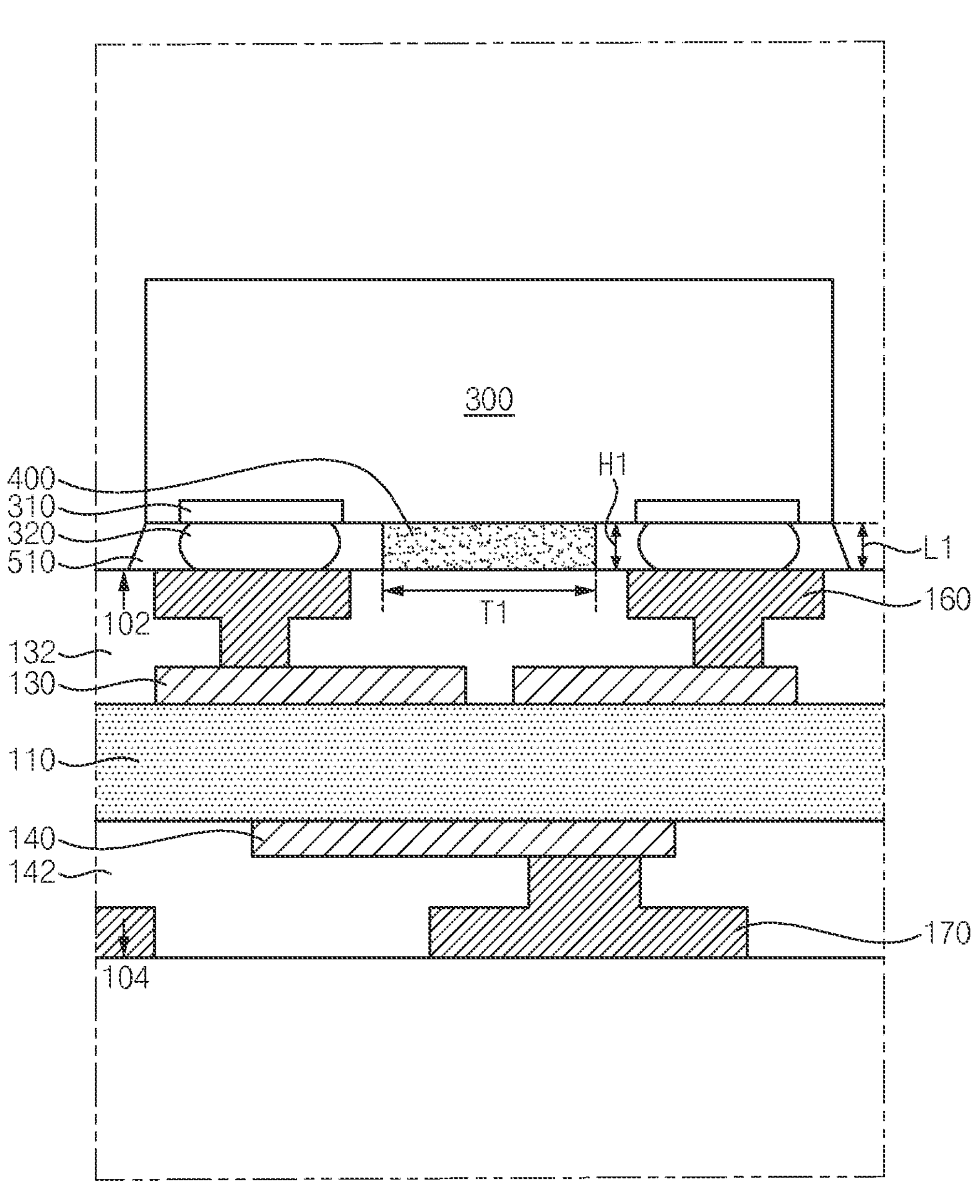
Figure 10:
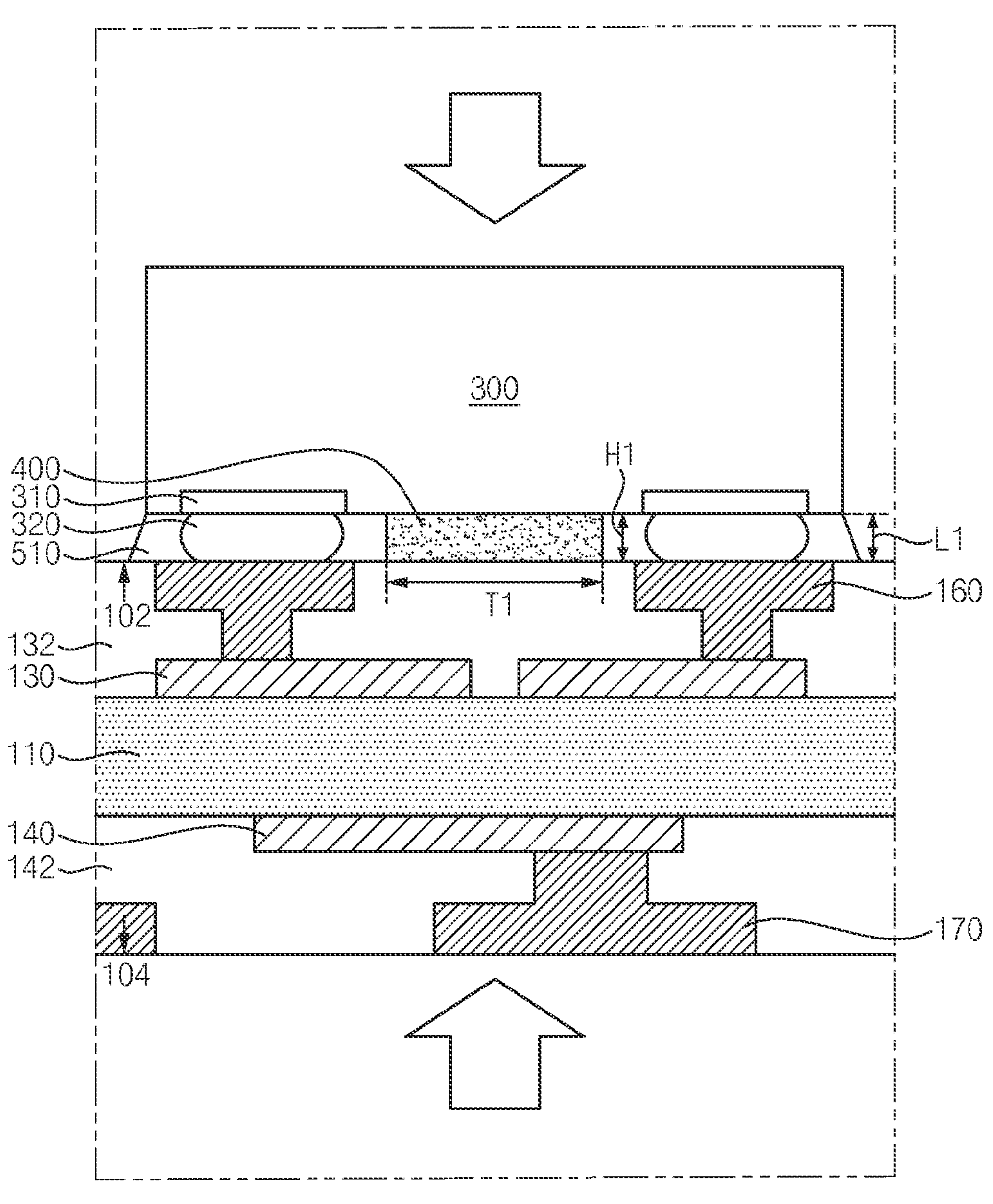
Figure 11:
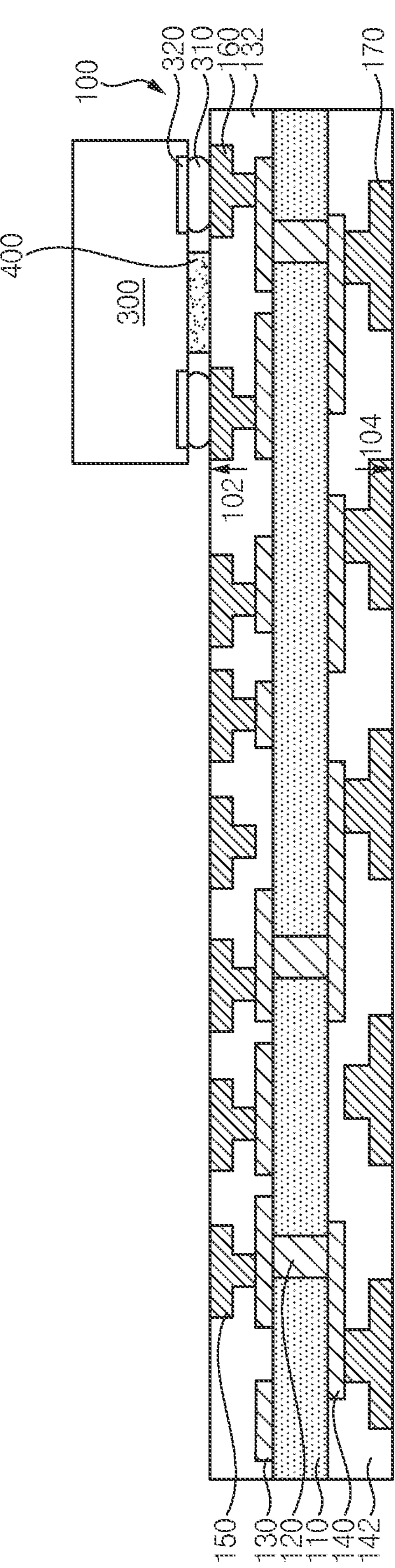

FIGS. 4 to 12 are cross-sectional views variously illustrating a method of manufacturing a semiconductor package according to embodiments of the inventive concept. Here, FIG. 4 is a plan view illustrating an exemplary semiconductor element; FIG. 5 is a cross-sectional view taken along line C-C' of FIG. 4; FIG. 6 is a plan view illustrating a package substrate; FIG. 7 is a cross-sectional view taken along line D-D' of FIG. 6; FIGS. 8, 9 and 10 are respective, enlarged cross-sectional views further illustrating portion 'E' indicated in FIG. 7; FIG. 11 further illustrates the mounting of the semiconductor element 300 on the package substrate 100; and FIG. 12 further illustrates the mounting of the semiconductor device 200 on the package substrate 100.

Referring to FIGS. 4 and 5, solder members 320 and the insulating spacer 400 may be formed on a lower surface of a semiconductor element 300.

In some embodiments, a plurality of electrodes 310 may be exposed on the lower surface of the semiconductor element 300. The solder members 320—serving as conductive connection members—may be respectively formed on the electrodes 310. For example, the solder members 320 may include micro bumps (μBumps).

In some embodiment, for example, the semiconductor element 300 may include at least one passive element, such as a MLCC, a LICC, a LSC, an inductor, an IPD, etc.

The solder members 320 may be respectively arranged in a peripheral region SA substantially surrounding a central region CA on the lower surface of the semiconductor element 300. The solder members 320 may be respectively disposed (or provided) on the electrodes 310. The solder members 320 may be electrically connected to the electrodes 310. In some embodiments, the solder members 320 may be formed in respective corners of the peripheral region SA. Accordingly, the solder members 320 may vertically support (or distribute) stress applied to the semiconductor element 300 at the respective corners.

The insulating spacer 400 may be formed in the central region CA on the lower surface of the semiconductor element 300 having a height H1 from the lower surface of the semiconductor element 300 that is less than or equal to a height H2 of the solder member 320 (e.g., a range of between about 2 μm to about 10 μm). Further, the insulating spacer 400 may have a width T1, wherein the width T1 of the insulating spacer 400 is less than a distance between the solder members 320 (e.g., a range of between about 15 μm to 50 μm). The insulating spacer 400 may include at least one of for example, a DAF, EMC, epoxy resin, UV resin, polyurethane resin, silicone resin, and silica filler.

Referring to FIGS. 6 and 7, the package substrate 100 may include; the core layer 110, the plurality of conductive through vias 120 penetrating the core layer 110, the plurality of upper and lower conductive patterns 130, 140, the upper and lower insulating layers 132, 142, and the plurality of first, second and third substrate pads 150, 160, 170.

The core layer 110 may include a non-conductive material layer, such as a reinforced polymer or the like. The core layer 110 may serve as a boundary portion generally dividing the package substrate 100 into an upper portion and an opposing lower portion. The upper insulating layer 132 may include first and second upper insulating layers **132*a*, 132*b* formed on the core layer 110. The lower insulating layer 142 may include first and second lower insulating layers 142*a*, 142*b* formed on the core layer 110**.

The conductive through via 120 may extend through the core layer 110 and electrically connect the upper conductive pattern 130 and the lower conductive pattern 140. When the semiconductor device 200 and the semiconductor element 300 are mounted on the upper surface 102 of the package substrate 100, the conductive through via 120 may electrically connect the semiconductor device 200 and the semiconductor element 300 to other electronic device(s) and/or semiconductor device(s) provided on the lower surface 104 of the package substrate 100.

In this regard, the first upper insulating layer **132*a* covering an upper surface of the core layer 110 may be formed, and the first lower insulating layer 142*a* covering a lower surface of the core layer 110 may be formed. The first upper insulating layer 132*a* may be patterned to form upper patterns exposing the upper surface of the core layer 110, and the first lower insulating layer 142*a* may be patterned to form lower patterns exposing the lower surface of the core layer 110**.

The upper conductive patterns 130 directly contacting the core layer 110 through the upper patterns may be formed on the first upper insulating layer **132*a*. The upper conductive patterns 130 may be formed by performing a first plating process on the first upper insulating layer 132*a*. The lower conductive patterns 140 may be formed on the first lower insulating layer 142*a* to directly contact the core layer 110 through the lower patterns. A second plating process may be performed on the first lower insulating layer 142*a* to form the lower conductive patterns 140**.

The first and second plating processes may include an electrolytic plating process or an electroless plating process, and the upper and lower conductive patterns 130, 140 may include at least one of aluminum (Al), copper (Cu), tin (Sn), nickel (Ni), gold (Au) and platinum (Pt).

Then, a second upper insulating layer **132*b* covering the upper conductive patterns 130 may be formed on the first upper insulating layer 132*a*, and first and second openings that expose the upper conductive patterns 130 may be formed by patterning the second upper insulating layer 132*b*. The first substrate pads 150 may be formed on the second upper insulating layer 132*b* to directly contact the upper conductive patterns 130 through the first openings, and the second substrate pads 160 may be formed on the second upper insulating layer 132*b* to directly contact the upper conductive patterns 130** through the second openings.

The second lower insulating layer **142*b* covering the lower conductive patterns 140 may be formed on the first lower insulating layer 142*a*, and third openings that expose the lower conductive patterns 140 may be formed by patterning the second lower insulating layer 142*b*. The third substrate pads 170 may be formed on the second lower insulating layer 142*b* to directly contact the lower conductive patterns 140** through the third openings.

The first to third substrate pads 150, 160, 170 may include at least one of for example, aluminum (Al), copper (Cu), tin (Sn), nickel (Ni), gold (Au) and platinum (Pt). The upper and lower insulating layers 132, 142 may include at least one of for example, a polymer and a dielectric layer. More particularly, the upper and lower insulating layers 132, 142 may include polyimide (PI), lead oxide (PbO), polyhydroxystyrene (PHS), NOVOLAC, or the like. The upper and lower insulating layers 132, 142 may be formed using a vapor deposition process, a spin coating process, or the like.

Referring to FIGS. 8, 9 10 and 11, one or more semiconductor elements 300 may be mounted on the package substrate 100.

In some embodiments, the "mounting" of the semiconductor elements 300 on the package substrate 100 may generally include: (1) properly positioning the semiconductor element in relation to the package substrate; and then (2) bonding the semiconductor element on the package substrate. In this regard, the positioning (or disposing) of the semiconductor element 300 in relation to the package substrate 100 may be performed using automated equipment or by hand, and the bonding of the semiconductor element 300 may be accomplished using a variety of processes, such as those, for example, described above. Further in this regard, the bonding of the semiconductor element 300 on the package substrate 100 may be accomplished in accordance with the particular structure of the semiconductor element 300.

Thus, in some embodiments, one or more semiconductor elements 300 (e.g., 2 to 15) may be disposed on the upper surface 102 of the package substrate 100. For example, the semiconductor elements 300 may be mounted on the package substrate 100 using a flip chip bonding method.

The semiconductor element 300 may be attached to the upper surface 102 of the package substrate 100 using a thermal compression process at a predetermined temperature. The thermal compression process may include a reflow process. The reflow process may be understood as a process providing stable bonding of the semiconductor element 300 to the package substrate 100 under application of a high-temperature provided by a heat source.

Referring to FIG. 10, an external force may be applied to an upper surface of the semiconductor element 300 and the lower surface 104 of the package substrate 100 during the thermal compression process. The semiconductor element 300 and the package substrate 100 may be bonded by this application of external force at high-temperature. That is, the solder members 320 of the semiconductor element 300 may be respectively bonded to the second substrate pads 160 formed on the upper surface 102 of the package substrate 100. Accordingly, vertical stress will be exerted upon the semiconductor element 300 in relation to the applied external force, and as noted above, the semiconductor element 300 may become damaged under the influence of the vertical stress and high-temperature in the absence of improvements provided by embodiments of the inventive concept.

Thus, the semiconductor element 300 may be electrically connected to the second substrate pads 160. The electrodes 310 of the semiconductor element 300 may be electrically connected to the second substrate pads 160 of the package substrate 100 by the solder members 320 as conductive connection members. Here, for example, the solder members 320 may include micro bumps (μBumps).

The lower surface of the semiconductor element 300 may be spaced apart from the upper surface 102 of the package substrate 100 by a vertical separating distance L1 (e.g., ranging from about 2 μm to about 10 μm).

During the thermal compression process, the solder members 320 may support the lower surface of the semiconductor element 300 at the peripheral region(s) SA surrounding the central region CA. The solder members 320 may support the vertical stress applied to an upper surface opposite to the lower surface of the semiconductor element 300. However, cracking (or other damage) may readily occur in the central region CA of the semiconductor element 300 given the absence of the solder members 320 and the application of vertical stress and high-temperature in the absence of improvements provided by embodiments of the inventive concept.

Fortunately, the insulating spacer 400 may be used to effectively support the lower surface of the semiconductor element 300 in the central region CA. The insulating spacer 400 may transfer (or distribute) vertical stress applied to the upper surface opposite to the lower surface of the semiconductor element 300. Since the insulating spacer 400 supports the lower surface of the semiconductor element 300 in the peripheral region SA of the semiconductor element 300 where the solder members 320 are not formed, the possibility of damage to the semiconductor element 300 is markedly reduced.

Figure 12:
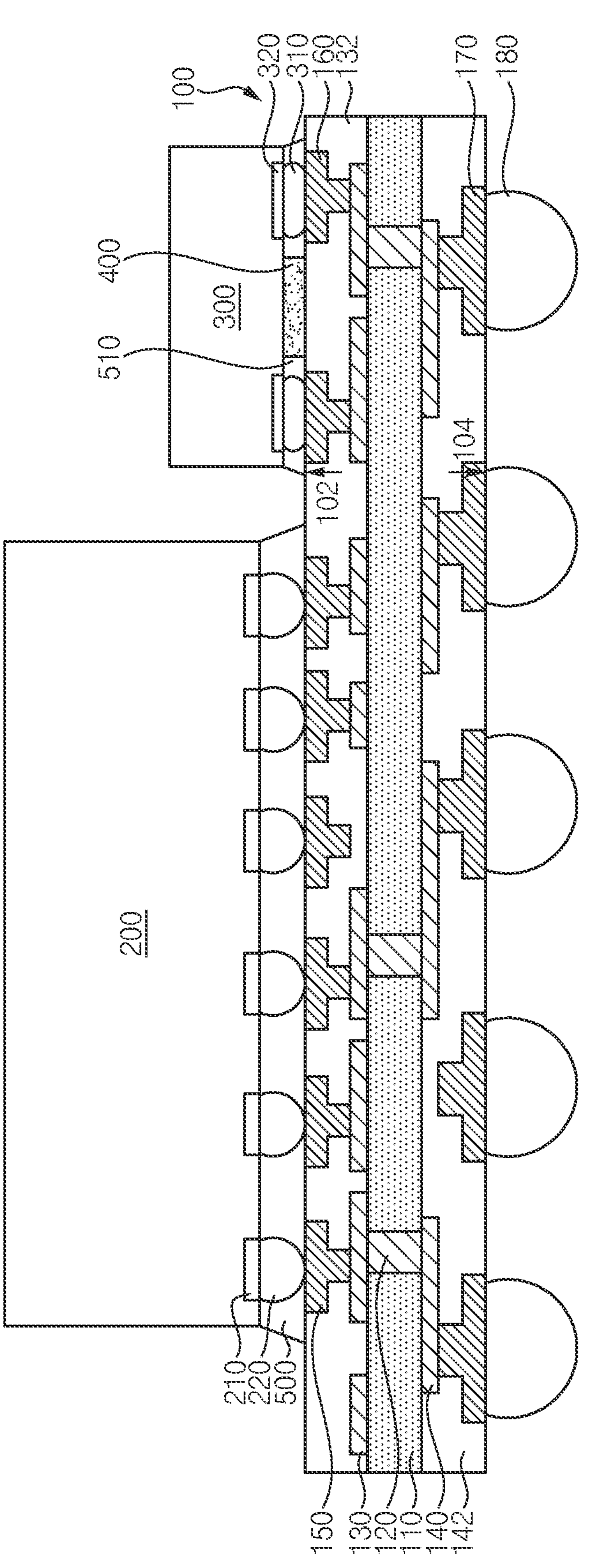

Referring to FIG. 12, the semiconductor device 200 may be mounted on the package substrate 100 using, for example, a flip chip bonding method. That is, the semiconductor device 200 may be mounted on the package substrate 100 using a thermal compression process.

The semiconductor device 200 may be bonded to the first substrate pads 150 by the conductive bumps 220 that are respectively provided on chip pads 210. The semiconductor device 200 and the semiconductor element 300 may be electrically connected to each other through the first and second substrate pads 150, 160 and the upper conductive pattern 130 of the package substrate 100.

Then, a first adhesive 500 may be introduced to underfill between the semiconductor device 200 and the package substrate 100, and a second adhesive 510 may be introduced to underfill between the semiconductor element 300 and the package substrate 100. In this manner, each of the first and second adhesives 500, 510 may reinforce respective spaces (or gaps) between the semiconductor device 200 and the semiconductor element 300 and the package substrate 100.

Thereafter, the semiconductor package 10 of FIG. 1 may be completed by forming external connection bumps 180 (e.g., solder balls) on the third substrate pads 170 of the lower surface 104 of the package substrate 100.

As described above in various embodiments, an insulating spacer may be provided between one or more semiconductor elements and the package substrate to fill corresponding spaces between the semiconductor elements and the package substrate. Since the insulating spacer effectively supports the semiconductor element from vertically applied stress during bonding of the semiconductor element to the package substrate, damage to the semiconductor element may be avoided.

The foregoing embodiments are illustrative in nature. Those skilled in the art will appreciate that many modifications are possible without materially departing from the scope of the inventive concept. Accordingly, all such modifications are intended to be included within the scope of inventive concept, as defined by the following claims.

What is claimed is:

1. A method of manufacturing a semiconductor package, the method comprising:

positioning at least one semiconductor element on an upper insulating layer of a package substrate, wherein the upper insulating layer of the package substrate exposes upper surfaces of first substrate pads and second substrate pads, each semiconductor element among the at least one semiconductor element includes electrodes on a lower surface of the at least one semiconductor element and respectively disposed in a peripheral region of the semiconductor element, solder members respectively on the electrodes, and an insulating spacer attached on the lower surface of the semiconductor element and disposed in a central portion of the semiconductor element between the solder members, wherein the insulating spacer extends outwardly from a center of the lower surface of the semiconductor element, and the solder members are respectively disposed on the second substrate pads;

bonding the at least one semiconductor element on the package substrate using the solder members, thereby causing the insulating spacer to contact the package substrate, wherein the insulating spacer is spaced apart from the package substrate before bonding the at least one semiconductor element on the package substrate; and bonding a semiconductor device on the package substrate, wherein the semiconductor device is laterally spaced apart from the semiconductor element on the package substrate.

2. The method of claim 1, wherein the bonding of the at least one semiconductor element on the package substrate includes electrically connecting the solder members to respective second substrate pads, and the bonding of the semiconductor device on the package substrate includes electrically connecting conductive bumps on a lower surface of the semiconductor device to respective first substrate pads.

3. The method of claim 1, wherein a height of the insulating spacer falls within a range of from about 2 μm to about 10 μm.

4. The method of claim 1, wherein a width of the insulating spacer falls within a range of from about 15 μm to about 50 μm.

5. The method of claim 1, wherein the at least one semiconductor element includes at least one of a multi-layer ceramic capacitor, a low inductance chip capacitor, an inductor, or an integrated passive device.

6. The method of claim 1, wherein a number of semiconductor elements of the at least one semiconductor element falls within a range of from 2 to 15.

7. The method of claim 1, wherein the bonding of the at least one semiconductor element on the package substrate includes vertically pressing on an upper surface of the at least one semiconductor element in a central region of the at least one semiconductor element.

8. The method of claim 1, wherein the insulating spacer includes at least one of a die attach film, an epoxy molding compound, epoxy resin, ultra-violet resin, polyurethane resin, silicone resin and silica filler.

9. The method of claim 1, wherein the semiconductor device includes at least one of a central processing unit, a graphics processing unit, a micro processing unit, a micro controller unit and an application processor.

10. A method of manufacturing a semiconductor package, the method comprising:

positioning a passive element on an upper insulating layer of a package substrate, wherein the upper insulating layer of the package substrate exposes upper surfaces of first substrate pads and second substrate pads, the passive element includes; electrodes on respective corners of a lower surface of the passive element, solder members respectively on the electrodes, and an insulating spacer on a central portion of the lower surface of the passive element between the solder members, wherein the insulating spacer extends outwardly from a center of the lower surface of the semiconductor element, and the solder members are respectively disposed on the second substrate pads;

bonding the passive element on the package substrate through the solder members and the second substrate pads, thereby causing the insulating spacer to contact with the package substrate, wherein the insulating spacer is spaced apart from the package substrate before bonding the passive element on the package substrate; and bonding a semiconductor device to the first substrate pads on the package substrate through conductive bumps on a lower surface of the semiconductor device, wherein the semiconductor device is laterally spaced apart from the passive element on the package substrate.

11. The method of claim 10, wherein the second substrate pads are electrically connected to the first substrate pads through wirings formed at least partially within the package substrate.

12. The method of claim 10, wherein a height of the insulating spacer falls in a range of from 2 μm to 10 μm, and a width of the insulating spacer falls in a range of from 15 μm to 50 μm.

13. The method of claim 10, wherein the passive element is at least one of a multi-layer ceramic capacitor, a low inductance chip capacitor, an inductor, or an integrated passive device.

14. The method of claim 10, wherein the bonding of the passive element on the package substrate includes vertically pressing on a central region of an upper surface of the passive element.

15. The method of claim 10, wherein the insulating spacer includes at least one of a die attach film, an epoxy molding compound, epoxy resin, ultra-violet resin, polyurethane resin, silicone resin and silica filler.

* * * * *